(12) United States Patent
Nishikawa

(10) Patent No.: US 7,135,782 B2
(45) Date of Patent: Nov. 14, 2006

(54) SEMICONDUCTOR MODULE AND PRODUCTION METHOD THEREFOR AND MODULE FOR IC CARDS AND THE LIKE

(75) Inventor: Masataka Nishikawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/289,395

(22) Filed: Nov. 7, 2002

(65) Prior Publication Data

US 2003/0102544 A1     Jun. 5, 2003

(30) Foreign Application Priority Data

Dec. 3, 2001 (JP) .............................. 2001-368945

(51) Int. Cl.
*H01L 23/28* (2006.01)
*H01L 23/48* (2006.01)
*H01L 23/52* (2006.01)
*H01L 23/04* (2006.01)

(52) U.S. Cl. ................. 257/796; 257/707; 257/784; 257/692; 257/698

(58) Field of Classification Search ............ 257/706, 257/707, 796, 713, 784, 703–705, 783, 701, 257/692, 698, 702
See application file for complete search history.

(56) References Cited

U.S. PATENT DOCUMENTS

| 5,311,059 | A |   | 5/1994  | Banerji et al.       |         |
|-----------|---|---|---------|----------------------|---------|
| 5,311,060 | A | * | 5/1994  | Rostoker et al.      | 257/796 |
| 5,430,331 | A | * | 7/1995  | Hamzehdoost et al.   | 257/796 |
| 5,552,635 | A | * | 9/1996  | Kim et al.           | 257/706 |
| 5,612,576 | A | * | 3/1997  | Wilson et al.        | 257/788 |
| 5,705,851 | A |   | 1/1998  | Mostafazadeh et al.  |         |
| 5,736,785 | A | * | 4/1998  | Chiang et al.        | 257/712 |
| 5,786,738 | A | * | 7/1998  | Ikata et al.         | 333/133 |
| 5,969,414 | A | * | 10/1999 | Parthasarathi et al. | 257/675 |
| 5,972,736 | A | * | 10/1999 | Malladi et al.       | 438/118 |
| 6,236,568 | B1| * | 5/2001  | Lai et al.           | 361/704 |
| 6,262,513 | B1| * | 7/2001  | Furukawa et al.      | 310/313 R |
| 6,308,938 | B1| * | 10/2001 | Futakuchi            | 257/780 |
| 6,369,455 | B1| * | 4/2002  | Ho et al.            | 257/796 |
| 6,492,194 | B1|   | 12/2002 | Bureau et al.        |         |
| 6,734,552 | B1| * | 5/2004  | Combs et al.         | 257/707 |
| 2001/0045644 | A1 | * | 11/2001 | Huang          | 257/718 |

FOREIGN PATENT DOCUMENTS

| JP | 60-76040   | 5/1985  |
| JP | 60-186985  | 9/1985  |
| JP | 6-1169746  | 7/1986  |
| JP | 06-163755  | 6/1994  |
| JP | 08-335650  | 12/1996 |
| JP | 09-162348  | 6/1997  |

(Continued)

OTHER PUBLICATIONS

European Search Report dated Aug. 10, 2005 EP 1 093 159 A1 dated Apr. 18, 2001 (U.S. Counterpart 6,492,194 listed above).

*Primary Examiner*—Nitin Parekh
(74) *Attorney, Agent, or Firm*—Nixon & Vanderhye P.C.

(57) ABSTRACT

A semiconductor module includes: a printed wiring board made of an insulator with conductor patterns formed on both sides thereof. An IC chip is mounted on the printed wiring board and sealed with a resin. A metallic sheet or moisture penetration blocking sheet is adhered on the IC chip surface opposite to the side that faces the printed wiring board.

7 Claims, 4 Drawing Sheets

FOREIGN PATENT DOCUMENTS

| | | | |
|---|---|---|---|
| JP | 11-238744 A | * | 8/1999 |
| JP | 11-296638 A | * | 10/1999 |
| JP | 2000-222549 | | 8/2000 |
| JP | 2000-311225 | | 11/2000 |
| JP | 2001-109860 | | 4/2001 |

* cited by examiner

SEMICONDUCTOR MODULE AND PRODUCTION METHOD THEREFOR AND MODULE FOR IC CARDS AND THE LIKE

BACKGROUND OF THE INVENTION (1) Field of the Invention

The present invention relates to a module having an IC chip provided thereon and a packaging technique for its assembly. Detailedly, the present invention relates to a semiconductor module which can be reduced in thickness and can still provide high reliability of the peripheral parts against environmental conditions, as well as relating to the production method of the same and a module for IC cards and the like.

(2) Description of the Prior Art

Recently, IC cards having a semiconductor integrated circuit device provided thereon have been put into practice as commutation tickets for public transportation such as buses, railroads and the like, financial cards including bank cards or identification cards. Since an IC card by itself has a data processing function and a high security function, which are not provided by magnetic cards, this advantage makes its application wider.

The IC cards are categorized into three types, i.e., contact type, non-contact type and combination type having both the contact type and non-contact type functions. For the first type or the contact type IC card, it has electrodes on the opposite side on which an IC chip is provided and the electrodes come into mechanical contact with a reader/writer device as an external device and functions as a terminal to be electrically connected. In contrast, for the second type or non-contact type IC card, it has an antenna, such as winding type inlet or etching coil type inlet, and is power supplied from, and exchanges data with, a reader/writer device in a non-contact manner by electromagnetic waves received through the antenna.

Since IC cards are inmost cases held in pockets of clothes, wallets, commutation pass cases and others, there is a strong demand for them to be portable. In order to achieve the portability, it is necessary to thin the IC card module since, in general, IC cards are easy to carry if they are 1.0 mm or thinner. In order to meet the request for a thin configuration, it is necessary to make the constituents of the IC card module, specifically, the printed wiring board, IC chip, bonding wires (especially, the height of wire looping) and sealing resin as thin as possible.

However, when an attempt is made to make the print circuit board thinner, the handling performance after provision of the IC chip will deteriorate in the packaging process in module fabrication. Accordingly, about 100 μm is the production limit at present. When an IC chip is used with a typical semiconductor package such as QFP(Quad Flat Package), SOP(Small Outline Package), CSP(Chip Size Package) or the like, the product cannot but become as thick as 200 μm as a minimum. Wire looping is formed at a height of about 150 μm from the top of IC chip, so when the IC chip and wires are sealed with resin, a resin filler of about 200 μm or thicker from the IC chip surface needs to be formed.

If an attempt was made to make there elements thinner, the IC chip would-break due to a bending load and would cause a fatal defect that causes the electric circuit of the IC chip not to work. In reducing the thickness of the sealing resin, if the epoxy resin contains a lower amount of filler, the whole module becomes liable to warp due to stresses in the resin and hence presents poor flatness and smoothness for the electric terminal surface of a contact type IC card, causing contact failure with the electric connection terminal of the reader/writer device. On the other hand, if the epoxy resin contains a large amount of filler, it presents poor fluidity and will produce unfilled portions.

Sealing techniques for producing thin IC modules with the necessary mechanical strength have been disclosed in Japanese Patent Application Laid-open Hei 11 No.296638 (to be referred to as the first prior art) and Japanese Patent Application Laid-open Hei 11 No.238744 (to be referred to as the second prior art) and the like. Specifically, Patent Application Laid-open Hei 11 No.296638 (the first prior art) discloses a technique for sealing an IC chip and its peripheral parts within a concave housing while leaving a hollow therein.

The sectional structure of a module of this technique is shown in FIG. 1. The module shown in this drawing has an IC chip 4 provided on a printed wiring board 20 while electrodes of IC chip 4 are electrically connected to predetermined terminals of printed wiring board 20 by wires 5, and then covered by a concave housing 17 so as to isolate and protect IC chip 4 and wires 5 from the outside air. In this technique, a material which has a higher modulus of elasticity than that of single crystalline silicon is used for concave housing 17 so as to protect IC chip 4 and reinforce the module.

However, in this prior art, the module is encased by joining only the interface between printed wiring board 20 and concave housing 17 while IC chip 4 and wires 5 remain within the hollow. When the module of this structure is formed into an IC card module card, and subjected to distortion, twist and other mechanical tests, the interface between printed wiring board 20 and concave housing 17 may crack and water can enter through the cracks easily. Further, if an organic substrate such as of glass epoxy, polyimide or the like is employed, repeated cycles of moisture absorption, reduction in ambient temperature and condensation of the interior atmosphere will cause condensation of water around IC chip 4 and its peripheral parts inside the hollowed space since the organic substrate itself easily permits moisture to penetrate therethrough. Thus, to improve the mechanical strength against bending, warping, twisting and the like, it is necessary to provide a structure having a high enough mechanical strength.

Japanese Patent Application Laid-open Hei 11 No.238744 (the second prior art) discloses a sealing technique in which an IC chip 4 is encapsulated with an uncured sealing resin, covered with a disk, called a topping foil 18, which is cut out from an epoxy or polyimide resin film by a punching tool, and cured. The sectional module structure of this prior art is shown in FIG. 2. The module shown in this drawing is constructed by providing an IC chip 4 on a printed wiring board 20, electrically connecting terminals of printed wiring board 20 with predetermined electrodes of IC chip 4, applying a liquid resin 19 over the chip and placing a sheet, i.e., topping foil 18, so as to secure a smooth surface.

According to this technology, it is possible to improve controllability of the module thickness by placing topping foil 18 over liquid resin 19. Further, topping foil 18 also serves as a reinforcing element and hence improves the resistance against impacts.

In the method disclosed in Japanese Patent Application Laid-open Hei 11 No.296638 (the first prior art), after provision of IC chip 4 on printed wiring board 20 by the flip chip mounting process or the COB(Chip On board) wire bonding process, the IC chip 4 and its peripheral parts on the printed wiring board are sealed along the rim of concave housing 17.

However, even though the concave housing 17 is formed of a material having an extremely low permeability, if a hollow exists inside concave housing 17, moisture penetration will occur through the surface of adhesion or through printed wiring board 20, which is usually formed of glass epoxy, polyimide or other organic compounds, and the temperature in the hollow will increase. For example, if the module is used under an external environment of 30° C., 70 % RH, the moisture inside concave housing 17 soon becomes equal to that of the external environment. When cooled from this condition, the moisture therein condenses and causes electric leakage in the interconnection circuit on the IC chip 4 surface and in printed wiring board 20, resulting in operation errors.

In Japanese Patent Application Laid-open Hei 11 No.238744 (the second prior art), topping foil 18 is cut out by a punching tool and placed and cured to complete sealing. This topping foil 18 plays the role of regulating the height of the resin seal of the IC card module and provides the reinforcing function, but will not provide any contribution to protection against external environment.

SUMMARY OF THE INVENTION

The present invention has been devised in view of what has been discussed above, it is therefore an object of the present invention to provide a semiconductor module which can prevent occurrence of defects accompanying penetration of moisture when exposed to a heavy environment such as a high temperature high humidity storage environment, a high temperature high humidity environment with a bias applied, a vapor pressurized environment or the like, which is comparable to the conditions of environment resistance tests on IC modules and which can reduce occurrence of defects in actual environment resistance tests and hence improve the production yield as well as improving the reliability under practical usage environments. That is, the object of the present invention is to provide such a semiconductor module and its production method and a module for IC cards and the like.

In order to achieve the above object, the present invention is configured as follows:

In accordance with the first aspect of the present invention, a semiconductor module, comprises: a printed wiring board made of an insulator with conductor patterns formed on both sides thereof; and a semiconductor chip mounted on the printed wiring board and sealed with a resin, and is characterized in that a metallic sheet or moisture penetration blocking sheet is adhered on the semiconductor chip surface opposite to the side that faces the printed wiring board.

In accordance with the second aspect of the present invention, the semiconductor module having the above first feature further comprises antenna connection terminals provided on the printed wiring board surface on which the semiconductor chip is provided and/or electric connection electrodes provided on the underside opposite to the surface on which the semiconductor chip is mounted.

In accordance with the third aspect of the present invention, the semiconductor module having the above first feature is characterized in that the metallic sheet is formed of stainless steel, 42 alloy, aluminum or copper.

In accordance with the fourth aspect of the present invention, the semiconductor module having the above first feature is characterized in that moisture penetration blocking sheet is formed of alumina ceramics.

In accordance with the fifth aspect of the present invention, the semiconductor having the above first feature is characterized in that the thickness of the metallic sheet or moisture penetration blocking sheet is 100 µm or below.

In accordance with the sixth aspect of the present invention, the semiconductor module having the above first feature is characterized in that an adhesive layer is provided for bonding the semiconductor chip and the metallic sheet or the moisture penetration blocking sheet and the thickness of the adhesive layer is 30 µm or below.

In accordance with the seventh aspect of the present invention, the semiconductor module having the above first feature is characterized in that the non-adhering surface of the metallic sheet is formed with indentations and projections.

In accordance with the eighth aspect of the present invention, a semiconductor module production method whereby a semiconductor chip is mounted on a printed wiring board made of an insulator with conductor patterns formed on both sides thereof and the printed wiring board having the semiconductor chip mounted thereon is sealed with a resin, comprises the steps of: mounting the semiconductor chip on the printed wiring board; implementing electric connection between these by wires; and adhering a metallic sheet or moisture penetration blocking sheet over the semiconductor chip surface with an adhesive layer therebetween before sealing with a mold resin over the semiconductor chip mounted side of the printed wiring board.

In accordance with the ninth aspect of the present invention, a semiconductor module production method whereby a semiconductor chip is mounted on a printed wiring board made of an insulator with conductor patterns formed on both sides thereof and the printed wiring board having the semiconductor chip mounted thereon is sealed with a resin, comprises the step of: forming indentations and projections on one side of the metallic sheet or moisture penetration blocking sheet which is adhered to the semiconductor chip surface before sealing with a mold resin over the semiconductor chip mounted side of the printed wiring board.

In accordance with the tenth aspect of the present invention, the semiconductor module production method having the above eighth feature is characterized in that electric connection with wires between the printed wiring board and the semiconductor chip is implemented by normal wire bonding or by joining wires by ball bonding to the electrodes of the semiconductor chip first and then joining them by stitch bonding to the predetermined terminals on the printed wiring board.

In accordance with the eleventh aspect of the present invention, the semiconductor module production method having the above ninth feature is characterized in that electric connection with wires between the printed wiring board and the semiconductor chip is implemented by normal wire bonding or by joining wires by ball bonding to the electrodes of the semiconductor chip first and then joining them by stitch bonding to the predetermined terminals on the printed wiring board.

In accordance with the twelfth aspect of the present invention, the semiconductor module production method having the above eighth feature is characterized in that electric connection with wires between the printed wiring board and the semiconductor chip is implemented by reverse wire bonding or by joining wires by ball bonding to the predetermined terminals of the printed wiring board first and then joining them by stitch bonding to the electrodes of the semiconductor chip.

In accordance with the thirteenth aspect of the present invention, the semiconductor module production method having the above ninth feature is characterized in that electric connection with wires between the printed wiring board and the semiconductor chip is implemented by reverse wire bonding or by joining wires by ball bonding to the predetermined terminals of the printed wiring board first and then joining them by stitch bonding to the electrodes of the semiconductor chip.

In accordance with the fourteenth aspect of the present invention, a module for IC cards and the like, includes a semiconductor module, comprising: a printed wiring board made of an insulator with conductor patterns formed on both sides thereof; and, a semiconductor chip mounted on the printed wiring board and sealed with a resin, wherein a metallic sheet or moisture penetration blocking sheet is adhered on the semiconductor chip surface opposite to the side that faces the printed wiring board.

Herein, the module for IC cards and the like may be of a non-contact type, contact type or combination type having both the contact type and non-contact type functions. The module for IC cards and the like is mainly used for IC card modules but should not be limited to this and can be applied for other purposes.

DESCRIPTION OF THE PREFERRED EMBODIMENTS

Figure 1:
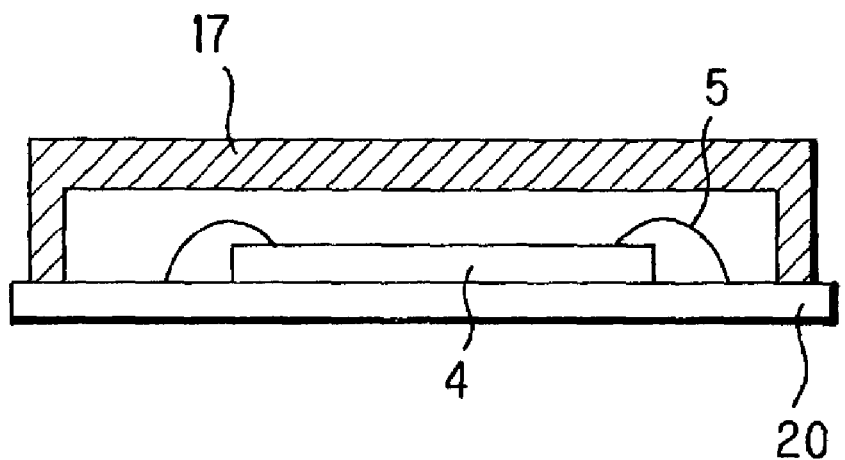
FIG. 1 is a sectional view showing the structure of a conventional technology disclosed by the first prior art.
Figure 2:
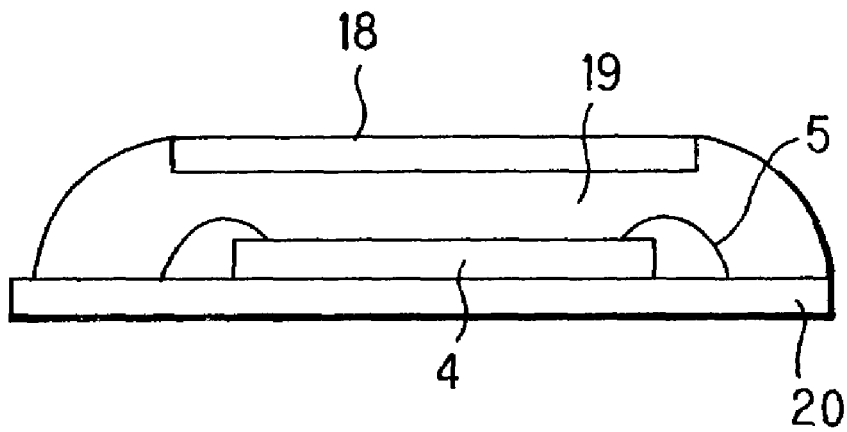
FIG. 2 is a sectional view showing the structure of another conventional technology disclosed by the second prior art.
Figure 3:
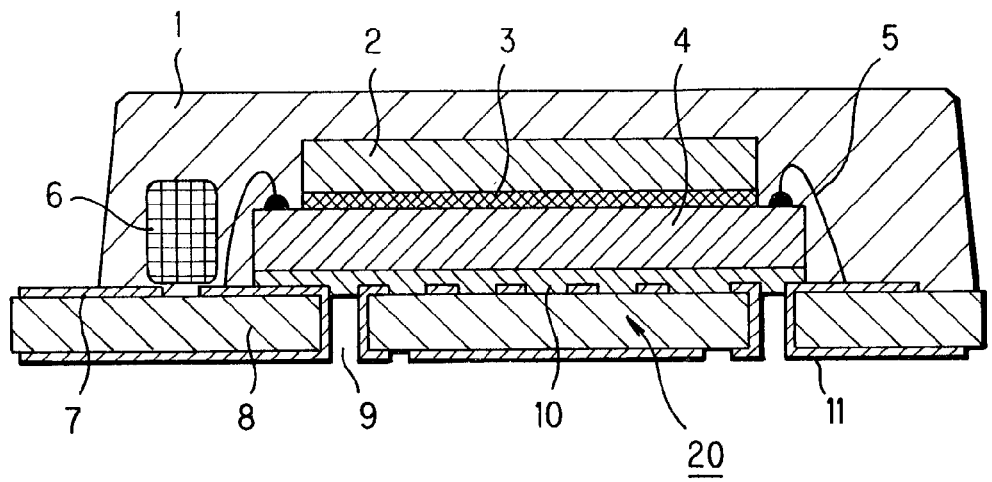
FIG. 3 is a sectional view showing the structure of a semiconductor module of an embodiment of the present invention.

Referring next to FIG. 3 and other drawings, the preferred embodiments of semiconductor modules and their production method and a module for IC cards and the like according to the present invention will be described.

A double-sided printed wiring board 20 is comprised of an insulating layer 8 for polyimide double-sided interconnections, made up of glass epoxy impregnated with epoxy resin, having a thickness of 50 to 100 μm and a conductor which can be patterned by etching or other processes (forming aftermentioned antenna connection terminals 7 for the module and predetermined terminals 11 of printed wiring board 20) such as copper foil or the like, adhered on both sides of the insulator. This conductor is specified to have a thickness of 8 to 20 μm.

Here, in the present embodiment, a glass epoxy substrate having conductor layers of 12 μm thick on both sides thereof is shown as an example, but the conductor should not be limited particularly as long as it falls within the above range.

Printed wiring board 20 has through-holes 9 drilled for electric connection between the conductor layers on both sides and has conductor layers of 10 μm thick formed on both sides by plating. The thus formed conductor layers are patterned by etching or the like to complete a printed wiring board 20.

Here, the printed wiring board 20 shown in the present embodiment has an insulating layer 8 of 80 μm thick.

Figure 9:
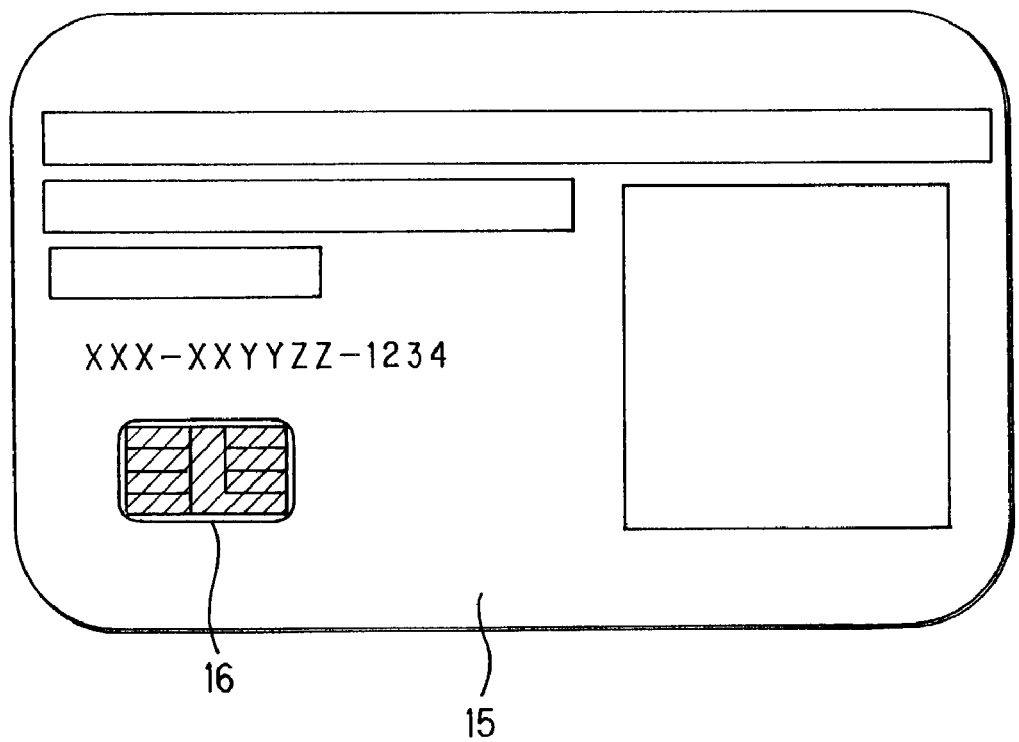
FIG. 9 is a plan view showing the IC card illustrated in FIG. 8.

IC chips 4 handled in a typical wafer fabrication process have a thickness of 400 to 700 μm, but for an IC card module 16 shown in FIG. 9, the undersurface of a wafer is ground so that a resultant IC chip 4 has a thickness of 50 to 200 μm. Here, description will be made taking an example of a wafer ground to 80 μm in thickness. A film adhesive 10 of 10 to 50 μm thick is applied beforehand on the underside of the wafer. The wafer is cut by a diamond blade or the like into chips so that each IC chip 4 with adhesive 10 is mounted to printed wiring board 20. Adhesive 10 may use thermosetting resin, thermoplastic resin or mixture of thermosetting and thermoplastic resins and is applied under the necessary temperature and pressure.

Adhesive 10 for IC chip 4 may be applied beforehand at the predetermined position on printed wiring board 20. The adhesive 10 for IC chip 4 here is specified to be 30 μm thick.

Figure 8:
FIG. 8 is a structural sectional view showing a semiconductor module of the present invention, embedded in an IC card substrate.

FIG. 8 is a structural sectional view showing a semiconductor module 16 of the present invention, embedded in an IC card substrate 15 and FIG. 9 is a plan view showing the IC card illustrated in FIG. 8.

Next, predetermined electrodes of IC chip 4 are connected to the predetermined terminals 11 on printed wiring board 20 by extra fine aluminum or gold wires having a diameter of 20 to 30 μm. FIG. 3 shows a configuration in which wire bonding using gold wire 5 is performed by a method generally called normal bonding. In this process, gold wire 5 is connected first at a predetermined electrode of IC chip 4, then the other end of wire 5 is joined to the associated terminal 11 on printed wiring board 20. When gold wire 5 is used, gold balls are formed in advance on the predetermined electrodes on IC chip 4.

Figure 4:
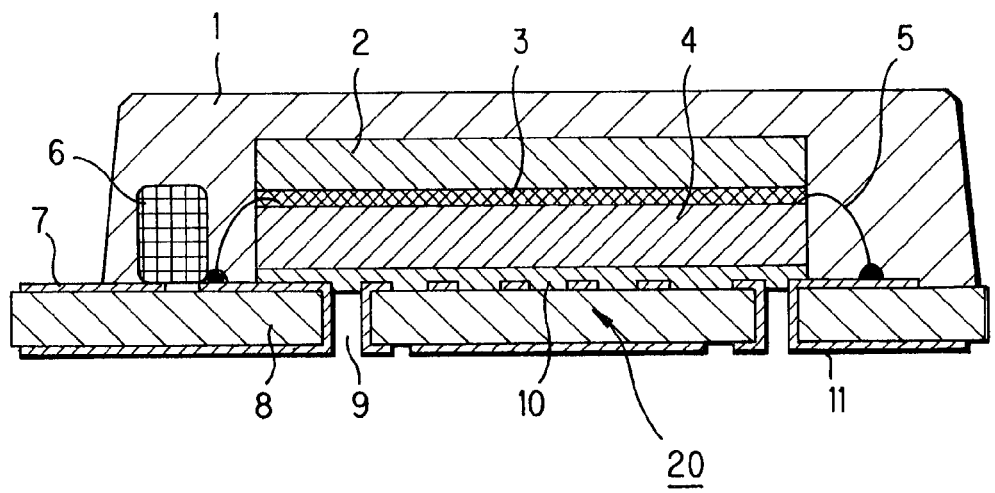
FIG. 4 is a sectional view showing the structure of a semiconductor module of another embodiment of the present invention.

It is of course possible to achieve reverse bonding whereby wire 5 is connected first to predetermined terminal 11 on printed wiring board 20 by ball bonding and then the other end of wire 5 is connected to the predetermined electrode of IC chip 4 by stitch bonding. In this case, gold balls are formed on the predetermined terminals 11 on printed wiring board 20 to which the wires are joined first. Adoption of this reverse bonding process makes it possible to reduce the bonding height of wire 5 (wire looping height), as shown in FIG. 4. As is apparent from the comparison between FIGS. 3 and 4, since no gold balls are provided on the electrode side of IC chip 4, it is possible to provide an aftermentioned sheet 2 for protection against moisture penetration, over the entire surface of IC chip 4.

Further, in order to achieve the main object of the present invention, i.e., prevention against internal penetration by external moisture, a sheet 2 having a thickness equal to or smaller than 100 μm is applied over the surface of IC chip 4 with an adhesive 3 having a thickness of 50 μm or smaller, before the mounted face of IC chip 4 is sealed with a mold resin as designated at a reference numeral 1. This sheet 2 may be formed of stainless steel, 42 alloy, aluminum, copper or other metal sheets, or may be a moisture penetration blocking sheet made of alumina ceramics providing the inhibition against moisture penetration. Here, the thickness of sheet 2 is set at 80 μm and the thickness of adhesive 3 is set at 30 μm.

Figure 5:
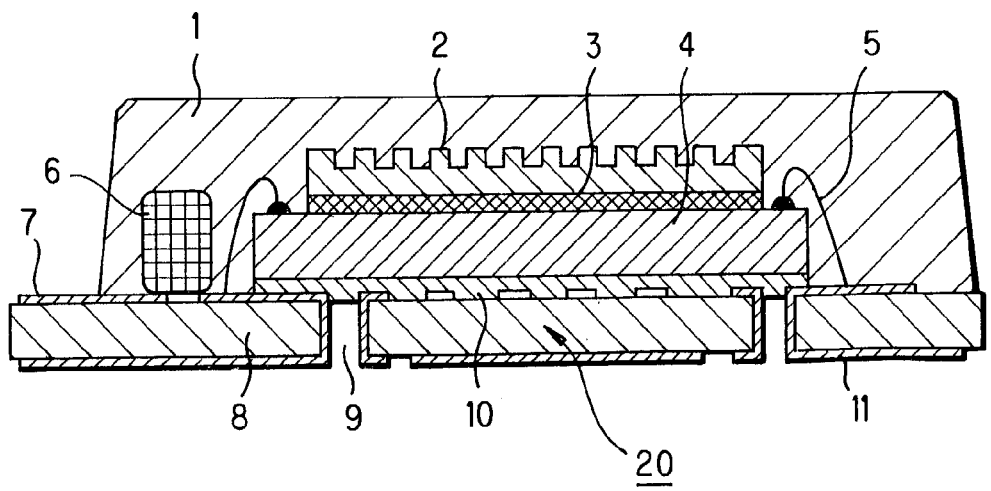
FIG. 5 is a sectional view showing the structure of a semiconductor module of another embodiment of the present invention.

Next, the second embodiment of the present invention will be described with reference to FIG. 5. In FIG. 5, the resin sealed surface of sheet 2 is formed with indentations and projections by etching, machining or other processes. Other configurations are the same as the above embodiment so that description is omitted.

In accordance with the present embodiment, provision of continual indentations and projections makes it possible to markedly improve the strength of adherence.

According to the above configuration, since sheet 2 for inhibiting moisture penetration is applied in tight contact with the top surface of IC chip 4 on which active circuitry is formed, it is possible to block moisture permeating through the bulk of epoxy resin 1 as the sealing resin, in a markedly effective manner. In other words, application of sheet 2 of 50 μm or smaller in thickness, which is made of stainless steel, 42 alloy, aluminum, copper or alumina ceramics totally shuts out moisture permeation, over IC chip 4 with adhesive 3, isolate IC chip 4 from epoxy resin 1, whereby no condensation of permeating moisture through epoxy resin 1 will occur over the interface of IC chip 4.

When the module is applied to IC card module 16, the module of the present invention has a more effective structure capable of providing an improved confidentiality compared to the configuration where the IC chip 4 surface is sealed with epoxy resin 1 only because the internal structure, or the circuitry forming face on the IC chip 4 surface cannot be viewed even if epoxy resin 1 is unsealed with a chemical having resin dissolving capability, such as hot concentrated sulfuric acid, fuming nitric acid and the like. Further, as the circuit of IC chip 4 is generally formed on a silicon substrate, the sheet 2 for inhibiting moisture from penetrating from the outside can also be expected to provide a reinforcing function of improving strength against bending of the thinned IC chip 4.

The IC card modules 16 shown in FIGS. 3 to 5 are provided with a tuning capacitor 6. This tuning capacitor 6 in cooperation with an antenna connected via antenna terminals 7, constitutes a tuning circuit for non-contact communication, and is used when the module is applied as a non-contact type IC card. If the module is dedicatedly used for contact type IC cards, this can be omitted.

As has been described, IC card module 16 can be completed, but it is necessary for a non-contact type IC card or combination type IC card for non-contact and contact types, to have an external communication antenna formed with the connection terminals.

Figure 6:
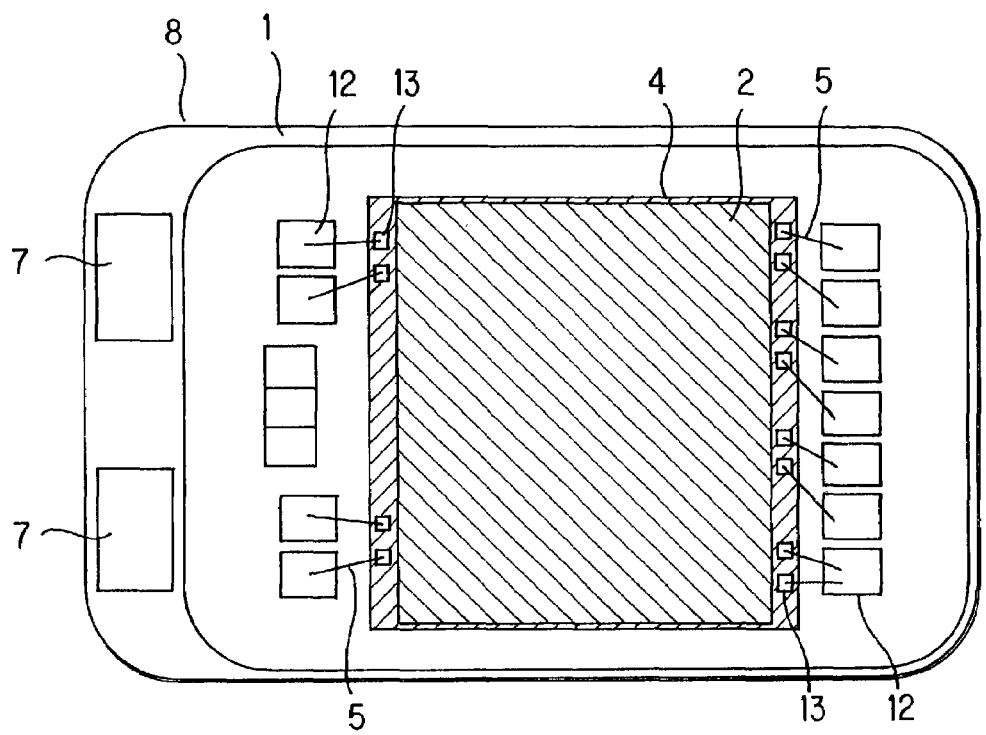
FIG. 6 is a plan view showing an embodiment of a semiconductor module of the present invention.
Figure 7:
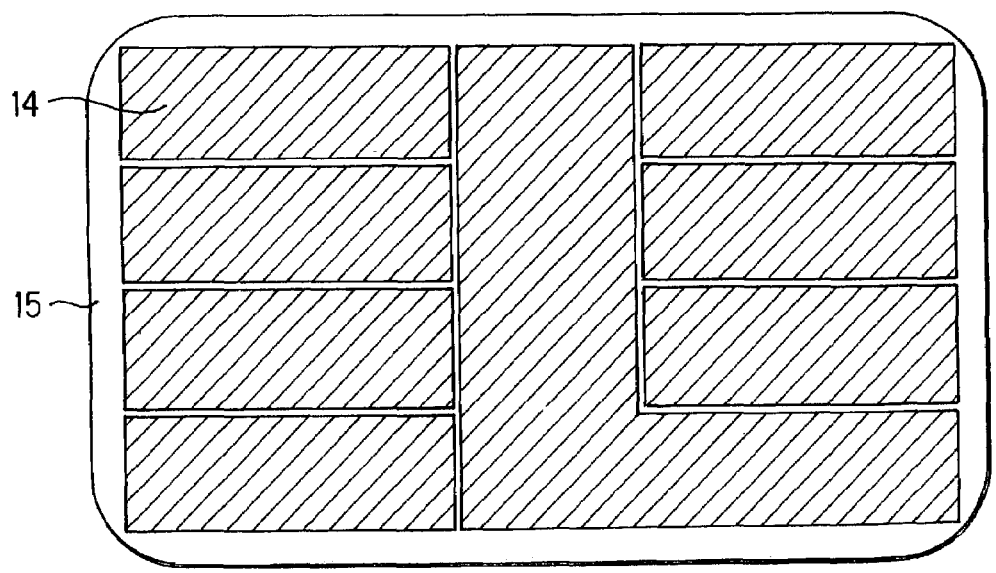
FIG. 7 is a plan view showing an electrode portion on the surface opposite to the IC chip mounted surface of an embodiment of a semiconductor module of the present invention.

FIG. 6 is a plan view showing the structure of a combination type IC card module 16 which has a tuning chip capacitor 6 with external terminals, mounted within the common resin sealed area. That is, the structure shown in FIG. 6 includes terminals for connection to an antenna for non-contact communication and tuning capacitor, and further has four sets of electrodes 14 for contact communication formed on the underside thereof, as shown in FIG. 7.

Detailedly, sheet 2 is applied on IC chip 4 with adhesive 3, and wire terminals 13 of IC chip 4 and wire terminals 12 of printed wiring board 20 including insulating layer 8 are bonded by wires 5. The whole structure is sealed with epoxy resin 1 so as to cover tuning capacitor 6. Further, a transmission/reception antenna connection terminals 7 are provided on printed wiring board 20.

The thickness of each part of the finished IC card module 16 of this embodiment is attained as follows. The thickness of insulating layer 8 of printed wiring board 20 is set at 80 μm. Since the conductor, e.g., copper is applied, in advance, on both sides of insulating layer 8 of printed wiring board 20 and then plating for through-holes 9 is implemented to electrically connect one side with the other of printed wiring board 20, the former and latter conductors are 12 μm and 10 μm, respectively. So, the thickness of the conductor formed on both sides of insulating layer 8 of printed wiring board 20 after through-hole plating is, in total, (12+10)×2=44 μm. Therefore, the thickness of printed wiring board 20 amounts to 124 μm. IC chip 4 is 80 μm thick, adhesive 10 for IC chip 4 is 30 μm thick and sheet 2 is 80 μm thick. Thus, the thicknesses are as follows:

The thickness of printed wiring board 20 including the conductors=124 μm

IC chip 4+adhesive 10=110 μm

Sheet 2+adhesive 3=110 μm

The total thickness=344 μm.

For the case where the above structure is sealed with epoxy resin 1 by transfer molding as shown in FIGS. 3 to 6, another 100 μm is needed to obtain improved fluidity of the resin, the total thickness of the resulting IC module 16 amounts to 344 μm+100 μm=444 μm.

Because of provision of sheet 2 for blocking moisture penetration, the thus obtained IC card module 16 of the present invention is able to avoid operation failures due to moisture penetration when it is exposed to a severe environment such as a high temperature high humidity storage environment (60° C. 90 % RH, or 85° C. 85 % RH), a high temperature high humidity storage environment with a bias (a voltage double that of the maximum rating is applied for bias test under a 60° C. 90 % RH or 85° C. 85 % RH environment) applied, or a vapor pressurized environment (121° C., 2 atm. and 100 % RH). Accordingly, it is possible to reduce the occurrence of defects in environmental tests on IC card modules 16 and improve the production yield as well as improving the reliability under usage environments.

Needless to say, the finished IC card module 16 is tested as to electric characteristics of IC chip 4.

As has been described, according to the above embodiment, a sheet 2 that blocks moisture penetration to the IC chip 4 surface of IC card module 16 is applied with adhesive 3 of a small thickness and epoxy resin 1 is injected to the assembly by the transfer molding process. Therefore, it is possible to create a strongly-built module configuration and provide a structure of IC card module 16 having excellent resistance against extreme environments. Since the components are fabricated with the above specified thicknesses, the IC card having this IC card module 16 can be further improved in portability and can be provided in an ultrathin configuration.

As for the specific environment resistance performance, the IC card module of the present invention is able to eliminate operation failures due to moisture penetration against severe environments comparable to environment resistance tests, such as a high temperature high humidity storage environment (60° C. 90 % RH, or 85° C. 85 % RH), a high temperature high humidity storage environment with a bias (a voltage double that of the maximum rating is applied for bias test under a 60° C. 90 % RH or 85° C. 85 % RH environment), or a vapor pressurized environment (121° C., 2 atm. and 100 % RH). This high resistance to environments makes it possible to reduce occurrence of defects in the environment resistance test before shipment, hence improve the production yield as well as improving the reliability under practical usage environments.

Further, since sheet 2 provides the reinforcing function for making up for the reduction in strength against bending accompanying the thinning of IC chip 4 mounted on the module, this configuration is able to maintain the mechanical strength in a markedly efficient manner even if, for example, the module is developed into a thin configuration.

Moreover, as a consequential result of the structure of IC card module 16, the sheet 2 will not be easily dissolved even if sealing epoxy resin 1 is unsealed with chemicals such as hot concentrated sulfuric acid, fuming nitric acid or the like and will be able to provide the function of a blocking layer which is resistant to chemicals. Therefore, the surface circuit structure on the IC chip 4 of the module cannot be viewed easily, so that this configuration is expected to provide remarkable security protection. Resultantly, the module of the present invention can be expected to provide unlimited effect even if it is applied to IC cards of which security is especially important.

As has been described heretofore, according to the present invention, it is possible to prevent occurrence of defects accompanying moisture penetration even under a severe environment such as a high temperature high humidity storage environment, high temperature high humidity environments with a bias applied, a vapor pressurized environment and the like, which are the requirements imposed by the environment resistance test of the IC card module. Further, achievement of the above effect makes it possible to reduce the occurrence of defects in the actual environment resistance test based on the aforementioned conditions and hence improve the production yield as well as improving the reliability under practical usage environments.

What is claimed is:

1. A semiconductor module, comprising:
a printed wiring board comprising an insulator with conductor patterns formed on both sides thereof;
a semiconductor chip mounted on the printed wiring board and sealed with a resin,
wherein a moisture penetration blocking sheet comprising a ceramic is adhered on the semiconductor chip surface opposite to the side that faces the printed wiring board via an adhesive layer so that the adhesive layer prevents the moisture penetration blocking sheet from directly contacting the semiconductor chip so that the moisture penetration blocking sheet is sufficiently spaced apart from the semiconductor chip so that the moisture penetration blocking sheet blocks moisture from reaching at least certain area(s) of the chip;
wherein a lateral edge of the moisture penetration blocking sheet is spaced inside a periphery of the semiconductor chip as viewed from above so that the moisture penetration blocking sheet has a surface area less than that of the semiconductor chip; and
a tuning circuit including a capacitor sealed by the resin and an antenna electrically connected to at least one antenna terminal, wherein the tuning circuit is for non-contact communication, and wherein the at least one antenna terminal is provided on the printed wiring board and includes a portion covered by the resin and another portion not covered by the resin.

2. The semiconductor module according to claim 1, wherein the moisture penetration blocking sheet comprises alumina ceramic.

3. The semiconductor module according to claim 1, wherein the thickness of the moisture penetration blocking sheet is 100 µm or below.

4. The semiconductor module according to claim 1, wherein a thickness of the adhesive layer is 30 µm or below.

5. The semiconductor module according to claim 1, wherein the non-adhering surface of the sheet is formed with indentations and projections.

6. An IC card including a semiconductor module, the semiconductor module of the IC card comprising:
a printed wiring board comprising an insulator with conductor patterns formed on both sides thereof; and, a semiconductor chip mounted on the printed wiring board and sealed with a resin,
wherein a moisture penetration blocking sheet comprising a ceramic is adhered on the semiconductor chip surface opposite to the side that faces the printed wiring board via an adhesive layer so that the adhesive layer prevents the moisture penetration blocking sheet from directly contacting the semiconductor chip so that the moisture penetration blocking sheet is sufficiently spaced apart from the semiconductor chip so that the moisture penetration blocking sheet blocks moisture;
a wiring connected via reverse bonding to the chip and at least one terminal on the printed wiring board so that the wiring is connected first to the terminal on the printed wiring board by ball bonding and then to an electrode of the chip via stitch bonding;
wherein a lateral edge of the moisture penetration blocking sheet is spaced inside a periphery of the semiconductor chip as viewed from above so that the moisture penetration blocking sheet has a surface area less than that of the semiconductor chip; and
a tuning circuit including a capacitor sealed by the resin and an antenna electrically connected to at least one antenna terminal, wherein the tuning circuit is for non-contact communication, and wherein the at least one antenna terminal is provided on the printed wiring board and includes a portion covered by the resin and another portion not covered by the resin.

7. A semiconductor module, comprising:
a printed wiring board comprising an insulator with conductor patterns formed on both sides thereof; and,
a semiconductor chip mounted on the printed wiring board and sealed with a resin,
wherein a moisture penetration blocking sheet comprising a ceramic is adhered on the semiconductor chip surface opposite to the side that faces the printed wiring board,
wherein no portion of the moisture penetration blocking sheet extends laterally beyond a periphery of the semiconductor chip on which the sheet is mounted, and
wherein the moisture penetration blocking sheet is sufficiently spaced apart from the semiconductor chip so that the moisture penetration blocking sheet blocks moisture from reaching at least certain area(s) of the chip;
a wiring connected to a terminal on the printed wiring board by ball bonding and to an electrode of the chip via stitch bonding;
wherein a lateral edge of the moisture penetration blocking sheet is spaced inside a periphery of the semiconductor chip as viewed from above so that the moisture penetration blocking sheet has a surface area less than that of the semiconductor chip; and
a tuning circuit including a capacitor sealed by the resin and an antenna electrically connected to at least one antenna terminal, wherein the tuning circuit is for non-contact communication, and wherein the at least one antenna terminal is provided on the printed wiring board and includes a portion covered by the resin and another portion not covered by the resin.

* * * * *